(12) United States Patent
Park et al.

(10) Patent No.: US 8,414,974 B2
(45) Date of Patent: Apr. 9, 2013

(54) METHOD OF MANUFACTURING SILICON NANOTUBES USING DOUGHNUT-SHAPED CATALYTIC METAL LAYER

(75) Inventors: Rae-Man Park, Daejeon (KR); Sang-Hyeob Kim, Daejeon (KR); Sunglyul Maeng, Chungcheongbuk-do (KR); Jonghyurk Park, Daegu (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/304,739

(22) PCT Filed: Dec. 8, 2006

(86) PCT No.: PCT/KR2006/005308
§ 371 (c)(1),
(2), (4) Date: Dec. 12, 2008

(87) PCT Pub. No.: WO2007/145406
PCT Pub. Date: Dec. 21, 2007

(65) Prior Publication Data
US 2009/0123649 A1 May 14, 2009

(30) Foreign Application Priority Data
Jun. 15, 2006 (KR) .................. 10-2006-0053897

(51) Int. Cl.
*C23C 16/24* (2006.01)
(52) U.S. Cl. .................... 427/255.18; 427/402; 427/314
(58) Field of Classification Search ............. 427/255.18
See application file for complete search history.

(56) References Cited

U.S. PATENT DOCUMENTS

| 2004/0175844 A1 | 9/2004 | Yang et al. |
| 2004/0240157 A1 * | 12/2004 | Legagneux et al. ........... 361/516 |
| 2007/0172409 A1 * | 7/2007 | Hikata ...................... 423/447.3 |
| 2008/0044336 A1 | 2/2008 | Kamisako et al. |

FOREIGN PATENT DOCUMENTS

| JP | 11-349321 | 12/1999 |
| JP | 2000048929 A * | 2/2000 |
| JP | 2005-139044 | 6/2005 |
| KR | 2006-0094862 | 8/2006 |
| WO | WO 2005082528 A1 * | 9/2005 |
| WO | WO-2006/057464 A2 | 6/2006 |

OTHER PUBLICATIONS

H. Okamoto, Pt-Si phase diagram, 1997, Journal of Phase Equilibria, vol. 18, No. 2, p. 226.*
V. Schmidt et al, Silicon nanowires: a review on aspects of their growth and their electrical properties. Advance Materials, 2009, vol. 21, p. 2681-2702.*
Feng-Huei Lin et al., "A study of silicon nitride nanotube synthesis at relative low temperature by thermal-heating chemical-vapor deposition method" Materials Chemistry and Physics, vol. 93, Issue 1, Sep. 15, 2005, pp. 10-15.

* cited by examiner

*Primary Examiner* — Roy King
*Assistant Examiner* — Xiaowei Su
(74) *Attorney, Agent, or Firm* — Rabin & Berdo, P.C.

(57) ABSTRACT

Provided is a method of manufacturing silicon nanotubes including forming non-catalytic metal islands on a substrate; forming catalyst metal doughnuts to surround the non-catalytic metal islands; and growing silicon nanotubes on the catalyst metal doughnuts. The silicon nanotubes are efficiently grown using the catalyst metal doughnuts.

10 Claims, 3 Drawing Sheets

METHOD OF MANUFACTURING SILICON NANOTUBES USING DOUGHNUT-SHAPED CATALYTIC METAL LAYER

TECHNICAL FIELD

The present invention relates to a method of manufacturing nanotubes and more particularly, to a method of manufacturing silicon nanotubes.

BACKGROUND ART

Carbon nanotubes are widely used in new high-speed and highly-integrated electrical components or sensors. Carbon nanotubes can be manufactured by thermal chemical vapor deposition in suitable growth conditions using a catalytic metal layer. Carbon nanotubes have both semiconductor and metal characteristics and such characteristics are hard to control as desired when the carbon nanotubes are manufactured.

As a result of this, silicon nanotubes have been developed. In general, silicon has semiconductor characteristics and thus, silicon nanotubes can be used in electric components and sensors. In addition, similar to carbon nanotubes, characteristics of silicon nanotubes are determined by the structure of the outer walls thereof. Silicon nanotubes have characteristics that are not known up to now and may be applied in various fields.

DISCLOSURE OF INVENTION

Technical Problem

However, if silicon nanotubes are manufactured using the method of manufacturing carbon nanotubes, the silicon nanotubes grow into nanowires, instead of nanotubes. Therefore, a method of growing silicon nanotubes is still unknown and results of research on silicon nanotubes have not been announced.

Technical Solution

The present invention provides a method of manufacturing silicon nanotubes to grow well.

According to an aspect of the present invention, there is provided a method of manufacturing silicon nanotubes, comprising: forming non-catalytic metal islands on a substrate; forming catalyst metal doughnuts to surround the non-catalytic metal islands; and growing silicon nanotubes on the catalyst metal doughnuts.

The non-catalytic metal islands may be manufactured by performing a first thermal treatment process on a non-catalytic metal layer, wherein the non-catalytic metal layer is formed on the substrate.

The non-catalytic metal islands may be manufactured by dry etching the non-catalytic metal layer, wherein the non-catalytic metal layer is formed on the substrate.

The catalyst metal doughnuts may be manufactured by performing a second thermal treatment process on the catalytic metal layer, wherein the catalytic metal layer is formed on the substrate where the non-catalytic metal islands are formed.

The catalytic metal layer may be formed of a material selected from the group consisting of nickel, gold, zinc, and iron.

According to another aspect of the present invention, there is provided a method of manufacturing silicon nanotubes, comprising: forming a non-catalytic metal layer on a substrate; forming non-catalytic metal islands by performing a first thermal treatment process on the non-catalytic metal layer, wherein the surface energy of the non-catalytic metal layer is reduced and thus, island-shaped clumps, that is, the non-catalytic metal islands, are generated; forming a catalytic metal layer on the substrate where the non-catalytic metal islands are formed; forming catalyst metal doughnuts to surround the non-catalytic metal islands by reducing the surface energy of the catalytic metal layer after performing a second thermal treatment process on the catalytic metal layer; and growing silicon nanotubes due to a reaction between the catalyst metal doughnuts and a silicon source on the catalyst metal doughnuts.

The non-catalytic metal layer may be formed of a material selected from the group consisting of chrome, platinum, and vanadium to have a thickness of 2 nm through 10 nm. The catalytic metal layer may be formed of a material selected from the group consisting of nickel, gold, zinc, and iron to have a thickness of 2 nm through 10 nm.

Advantageous Effects

According to the present invention, the silicon nanotube can be efficiently manufactured by growing the silicon nanotube using the catalyst metal doughnuts. According to the present invention, silicon nanotubes can be efficiently manufactured by growing the silicon nanotubes using catalyst metal doughnuts instead of simply using a catalytic metal layer used in the manufacture of carbon nanotubes.

BRIEF DESCRIPTION OF THE DRAWINGS

The above and other features and advantages of the present invention will become more apparent by describing in detail exemplary embodiments thereof with reference to the attached drawings in which.

MODE FOR THE INVENTION

Figure 1:
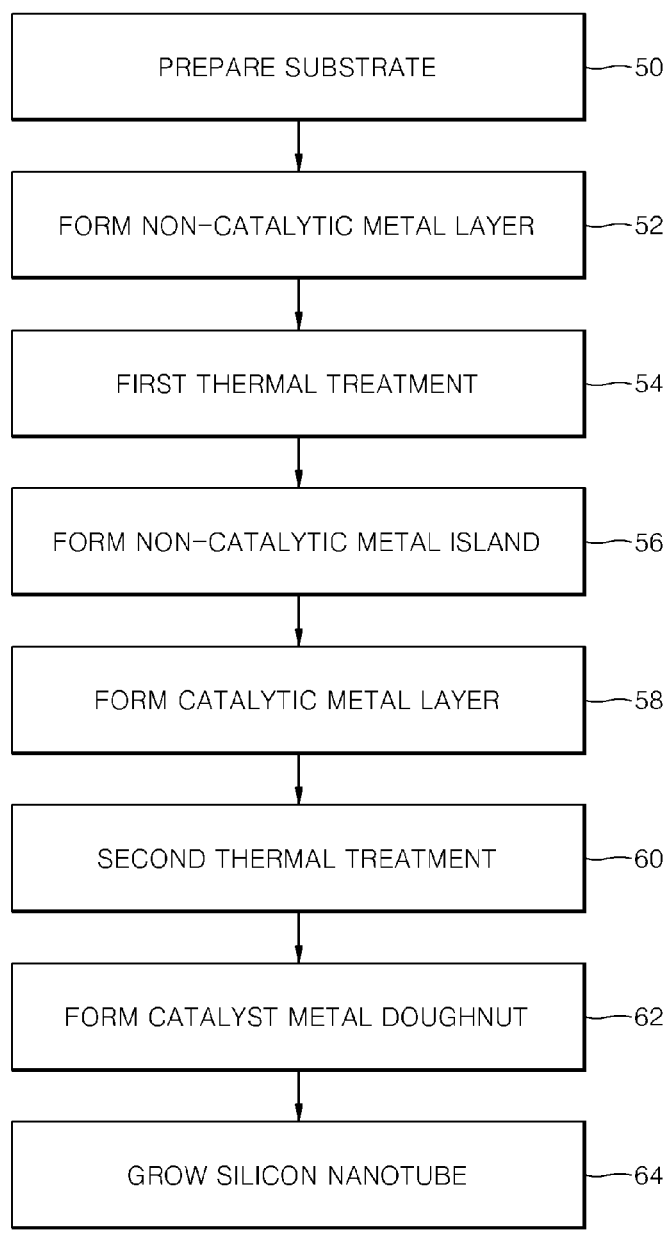
FIG. 1 is a flowchart illustrating a method of manufacturing silicon nanotubes according to an embodiment of the present invention.

Hereinafter, the present invention will be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, like reference numerals denote like elements, and the sizes and thicknesses of layers and regions are exaggerated for clarity.

As described in the 'Description of the Related Art' of the present invention, when a method of manufacturing carbon nanotubes is used to grow silicon nanotubes, the silicon nanotubes grow into nanowires, instead of nanotubes. However, according to an embodiment of the present invention, a doughnut-shaped catalytic metal layer is used to grow the silicon nanotubes. In other words, in order to grow silicon nanotubes on a substrate, a non-catalytic metal layer is grown into a plurality of islands and then, a catalytic metal layer is formed in a doughnut shape around the islands formed of the non-catalytic metal layer. When a silicon layer is formed on the doughnut-shaped catalytic metal layer, silicon nanotubes can be grown safely. Hereinafter, a method of manufacturing the silicon nanotubes according to an embodiment of the present invention will be described in detail.

Figure 2:
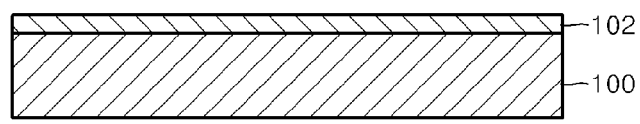
FIGS. 2 through 5 are cross sectional views illustrating a method of manufacturing silicon nanotubes according to an embodiment of the present invention.
Figure 3:
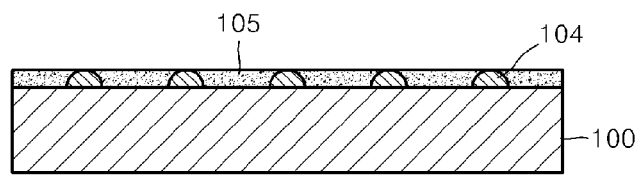
Figure 4:
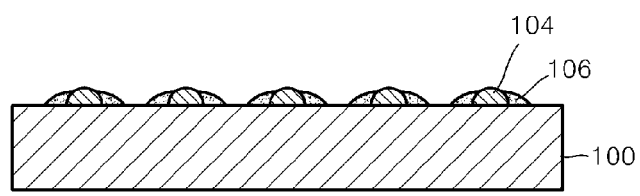
Figure 5:
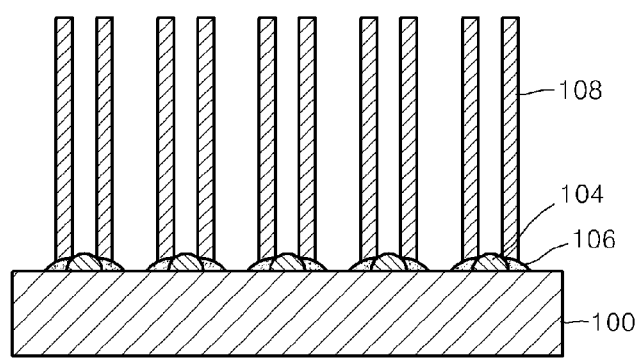
Figure 6:
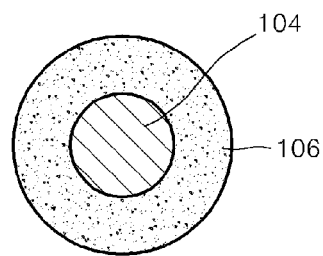
FIG. 6 is a planar view of one of the silicon nanotubes of FIG. 4, according to an embodiment of the present invention.

FIG. 1 is a flowchart illustrating a method of manufacturing silicon nanotubes according to an embodiment of the present invention, FIGS. 2 through 5 are cross sectional views illustrating the method of manufacturing the silicon nanotubes according to an embodiment of the present invention, and FIG. 6 is a planar view of the silicon nanotubes of FIG. 4, according to an embodiment of the present invention.

Specifically, a substrate 100, for example, a silicon substrate, is washed using a chemical method (Operation 50). As illustrated in FIG. 2, a non-catalytic metal layer 102 is formed on the substrate 100. The non-catalytic metal layer 102 is formed of chrome, platinum, or vanadium and is formed using a method of evaporation and sputtering. The non-catalytic metal layer 102 may have a thickness of 2 nm through 10 nm, for example, 3 nm (Operation 52). A first thermal treatment process is performed on the non-catalytic metal layer 102. The first thermal treatment process is performed by putting the substrate 100, on which the non-catalytic metal layer 102 is formed, into a reaction chamber of a thermal treatment apparatus (not illustrated) at a temperature of 400 through 700° C. for 30 seconds through 5 minutes (Operation 54). When the first thermal treatment process is completed, surface energy of the non-catalytic metal layer 102 is reduced and thus, island-shaped clumps are generated. Accordingly, non-catalytic metal islands 104 are formed on the substrate 100 as illustrated in FIG. 3. The non-catalytic metal islands 104 are formed in a circular or elliptical shape. The inner diameter of silicon nanotubes 108 (FIG. 5) to be formed later is determined according to the diameter of the non-catalytic metal islands 104 (Operation 56).

According to an embodiment of the present invention, the non-catalytic metal islands 104 are formed using the first thermal treatment process performed on the non-catalytic metal layer 102, however, the non-catalytic metal islands 104 can also be formed using a dry etching method. That is, after the non-catalytic metal layer 102 is formed on the substrate 100, a micro patterning process is performed using ultraviolet rays or electron beams and the non-catalytic metal layer 102 is dry etched, thereby forming the non-catalytic metal islands 104.

As illustrated in FIG. 3, a catalytic metal layer 105 is formed on the upper surface of the substrate 100 on which the non-catalytic metal islands 104 are formed. The catalytic metal layer 105 is formed of nickel, gold, zinc, or iron and is formed using a method of evaporation and sputtering. The catalytic metal layer 105 may have a thickness of 2 nm through 10 nm, for example, 3 nm (Operation 58).

A second thermal treatment process is performed on the catalytic metal layer 105. The second thermal treatment process is performed by putting the substrate 100, on which the catalytic metal layer 105 is formed, into a reaction chamber of the thermal treatment apparatus (not illustrated) at a temperature of 300 through 500° C. for 30 seconds through 5 minutes (Operation 60). When the second thermal treatment process is completed, surface energy of the catalytic metal layer 105 is reduced and thus, doughnut-shaped clumps are generated. Accordingly, catalyst metal doughnuts 106 are formed surrounding the non-catalytic metal islands 104 as illustrated in FIGS. 4 and 6. That is, since surface energy of the catalytic metal layer 105 is reduced, the catalytic metal layer 105 is centered on the non-catalytic metal islands 104 to surround the non-catalytic metal islands 104 and as a result, the catalyst metal doughnuts 106 are formed. The outer diameter of the silicon nanotubes 108 (FIG. 5) to be formed later is determined according to the diameter of the catalyst metal doughnuts 106 (Operation 62).

According to an embodiment of the present invention, the catalyst metal doughnuts 106 are formed using the second thermal treatment process performed on the catalytic metal layer 105, however, the catalyst metal doughnuts 106 can also be formed during the growing of the silicon nanotubes 108 in a growth apparatus in a later process without performing the second thermal treatment process. In other words, in the later process of growing the silicon nanotubes 108, the catalytic metal layer 105 is slightly melted forming clumps or moves to some extent on the substrate 100. Therefore, when the temperature of the reaction chamber where the substrate 100 including the catalytic metal layer 105 is put therein is raised, the catalyst metal doughnuts 106 are adequately formed without performing the second thermal treatment process.

As illustrated in FIG. 5, the silicon nanotubes 108 are formed on the catalyst metal doughnuts 106. The silicon nanotubes 108 are formed only on the catalyst metal doughnuts 106 and are not formed on the non-catalytic metal islands 104. Therefore, the silicon nanotubes 108 formed on the catalyst metal doughnut 106 can be obtained according to the current embodiment of the present invention (Operation 64). A method of growing the silicon nanotubes 108 according to an embodiment of the present invention will be described in more detail later.

Figure 7:
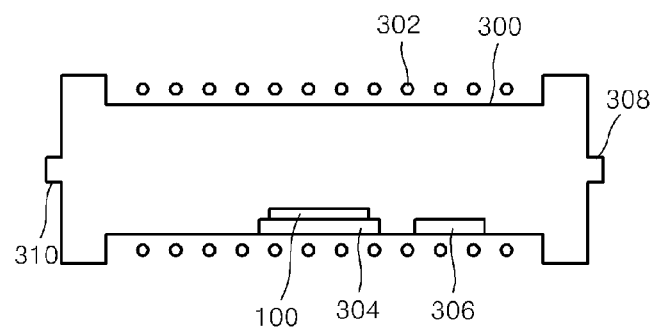
FIG. 7 is a structural view schematically illustrating a growth apparatus used to grow the silicon nanotubes of FIG. 5, according to an embodiment of the present invention.
Figure 8:
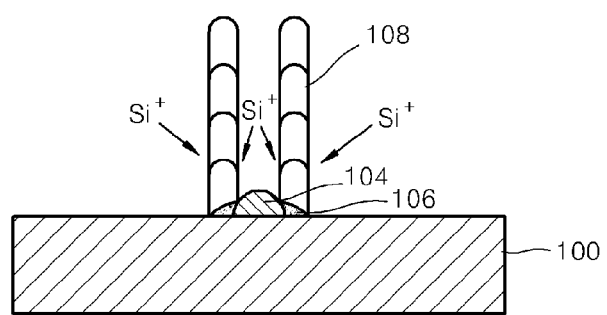
FIG. 8 is a diagram schematically illustrating a growth mechanism of the silicon nanotubes of FIG. 5, according to an embodiment of the present invention.

FIG. 7 is a structural view schematically illustrating a growth apparatus used to grow the silicon nanotubes 108 of FIG. 5, according to an embodiment of the present invention and FIG. 8 is a diagram schematically illustrating a growth mechanism of the silicon nanotubes 108 of FIG. 5, according to an embodiment of the present invention.

Specifically, the growth apparatus used to grow the silicon nanotubes 108 is a thermal chemical vapor deposition (CVD) apparatus. The thermal CVD apparatus includes a chamber 300 including a heater 302, a boat 304 in which a substrate 100 is disposed, in the chamber 300, and silicon powder source 306 adjacent to the boat 304. The silicon powder source 306 may be silicon powder or a mixture powder of silicon oxide and carbon. The chamber 300 includes a gas inlet hole 308 and a gas outlet hole 310 in respective both ends of the chamber 300. The silicon powder source 306 is used in growing the silicon nanotubes 108, however, silicon source gas, for example, $SiCl_4$, $SiHCl_3$, $SiHl_2Cl_2$, $SiH_4$, and $Si_2H_6$ can also be used using the gas inlet hole 308 and the gas outlet hole 310.

A process of growing the silicon nanotubes 108 using the growth apparatus described above will now described, according to an embodiment of the present invention. A substrate 100 is disposed on the boat 304. Then the chamber 300 is set to a growth temperature of 700 through 1000° C., for example, 800° C. and 100 through 1000 sccm of argon gas flows into the chamber through the gas inlet hole 308. Then silicon is decomposed in the silicon powder source 306 to obtain silicon ions (or silicon atoms) and the obtained silicon ions (or silicon atoms) are absorbed in the catalyst metal doughnuts 106 to be dissolved.

When silicon atoms are continuously diffused into the catalyst metal doughnuts 106, the silicon nanotubes 108 are grown on the catalyst metal doughnuts 106. When silicon is dissolved in the silicon powder source 306, the non-catalytic metal islands 104 are formed in the catalyst metal doughnuts 106. However, a reaction between the catalyst metal doughnuts 106 and silicon is better than a reaction between the non-catalytic metal islands 104 and silicon and thus, a silicon structure does not grow on the non-catalytic metal islands 104. Consequently, the silicon nanotubes 108 are grown due to a reaction between silicon source supplied by the silicon powder source 306 and the catalyst metal doughnuts 106.

As described above, according to the present invention, silicon nanotubes can be efficiently manufactured by growing the silicon nanotubes using catalyst metal doughnuts instead of simply using a catalytic metal layer used in the manufacture of carbon nanotubes.

In addition, in the present invention, non-catalytic metal islands are formed on the substrate and the catalytic metal layer is formed surrounding the non-catalytic metal islands, thereby forming the catalyst metal doughnuts. Then the silicon nanotubes are grown on the catalyst metal doughnuts. Therefore, silicon nanotubes can be efficiently grown even if a catalytic metal layer is used.

While the present invention has been particularly shown and described with reference to exemplary embodiments thereof, it will be understood by those of ordinary skill in the art that various changes in form and details may be made therein without departing from the spirit and scope of the present invention as defined by the following claims.

INDUSTRIAL APPLICABILITY

The present invention provides a method of manufacturing nanotubes and more particularly, to a method of manufacturing silicon nanotubes.

The invention claimed is:

1. A method of manufacturing silicon nanotubes, comprising:
    forming non-catalytic metal islands on a substrate;
    forming catalyst metal doughnuts to surround the non-catalytic metal islands; and
    growing silicon nanotubes on the catalyst metal doughnuts,
    wherein the catalyst metal doughnuts are manufactured by performing a thermal treatment process on a catalytic metal layer, and the catalytic metal layer is formed on the substrate where the non-catalytic metal islands are formed.

2. The method of claim 1, wherein the non-catalytic metal islands are manufactured by performing a thermal treatment process on a non-catalytic metal layer, wherein the non-catalytic metal layer is formed on the substrate.

3. The method of claim 2, wherein the non-catalytic metal layer is formed of a material selected from the group consisting of chrome, platinum, and vanadium.

4. The method of claim 1, wherein the non-catalytic metal islands are manufactured by dry etching a non-catalytic metal layer, wherein the non-catalytic metal layer is formed on the substrate.

5. The method of claim 1, wherein the catalytic metal layer is formed of a material selected from the group consisting of nickel, gold, zinc, and iron.

6. The method of claim 1, wherein the silicon nanotubes are formed due to a reaction between the catalyst metal doughnuts and a silicon source which occurs in a thermal chemical vapor deposition (CVD) apparatus.

7. A method of manufacturing silicon nanotubes, comprising:
    forming a non-catalytic metal layer on a substrate;
    forming non-catalytic metal islands by performing a first thermal treatment process on the non-catalytic metal layer, wherein the surface energy of the non-catalytic metal layer is reduced and thus the non-catalytic metal islands are generated;
    forming a catalytic metal layer on the substrate where the non-catalytic metal islands are formed;
    forming catalyst metal doughnuts to surround the non-catalytic metal islands by reducing the surface energy of the catalytic metal layer after performing a second thermal treatment process on the catalytic metal layer; and
    growing silicon nanotubes due to a reaction between the catalyst metal doughnuts and a silicon source on the catalyst metal doughnuts.

8. The method of claim 7, wherein the non-catalytic metal layer is formed of a material selected from the group consisting of chrome, platinum, and vanadium to have a thickness of 2 nm through 10 nm.

9. The method of claim 7, wherein the catalytic metal layer is formed of a material selected from the group consisting of nickel, gold, zinc, and iron to have a thickness of 2 nm through 10 nm.

10. The method of claim 7, wherein the silicon nanotubes are formed using a thermal chemical vapor deposition (CVD) method.

* * * * *